US012520426B2

(12) United States Patent
Haswarey et al.

(10) Patent No.: US 12,520,426 B2
(45) Date of Patent: Jan. 6, 2026

(54) CAPACITOR IN A SUBSTRATE VIA

(71) Applicant: Intel Corporation, Santa Clara, CA (US)

(72) Inventors: Aslam Haswarey, Portland, OR (US); Anne Augustine, Chandler, AZ (US); Yan Fen Shen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 770 days.

(21) Appl. No.: 17/710,944

(22) Filed: Mar. 31, 2022

(65) Prior Publication Data

US 2023/0319997 A1 Oct. 5, 2023

(51) Int. Cl.
| | |
|---|---|
| *H05K 1/16* | (2006.01) |
| *H05K 1/18* | (2006.01) |
| *H05K 3/00* | (2006.01) |
| *H05K 3/42* | (2006.01) |

(52) U.S. Cl.
CPC .......... *H05K 1/162* (2013.01); *H05K 3/0094* (2013.01); *H05K 3/429* (2013.01); *H05K 1/181* (2013.01); *H05K 2201/09563* (2013.01); *H05K 2201/0959* (2013.01); *H05K 2201/09636* (2013.01); *H05K 2201/09672* (2013.01); *H05K 2201/09809* (2013.01); *H05K 2201/10378* (2013.01)

(58) Field of Classification Search
None
See application file for complete search history.

(56) References Cited

U.S. PATENT DOCUMENTS

| | | | |
|---|---|---|---|
| 7,964,972 B2 * | 6/2011 | Matsui .................. | H01L 23/552 257/774 |
| 9,431,475 B2 * | 8/2016 | Oganesian ............. | H10D 1/042 |
| 2002/0105774 A1 * | 8/2002 | Wermer .................. | H05K 1/162 361/311 |
| 2007/0290328 A1 * | 12/2007 | Lin ....................... | H05K 1/0204 257/701 |
| 2012/0133021 A1 * | 5/2012 | Joblot ................... | H01L 23/642 257/532 |

* cited by examiner

*Primary Examiner* — Timothy J Thompson
*Assistant Examiner* — John B Freal
(74) *Attorney, Agent, or Firm* — Schwabe, Williamson & Wyatt P.C.

(57) ABSTRACT

Embodiments herein relate to systems, apparatuses, or processes to using vias, or plated through holes (PTH), within a substrate or within a sub laminate to create capacitors. The interior of a via may have a first layer, or coating, of an electrically conductive material such as copper, formed on the sides of the via. A second layer including a dielectric material is placed on the first layer of the electrically conductive material. A third layer of electrically conductive material may then be placed on the second layer of the dielectric material. Other embodiments may be described and/or claimed.

24 Claims, 12 Drawing Sheets

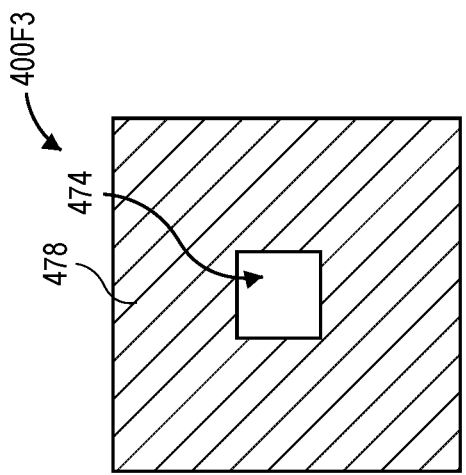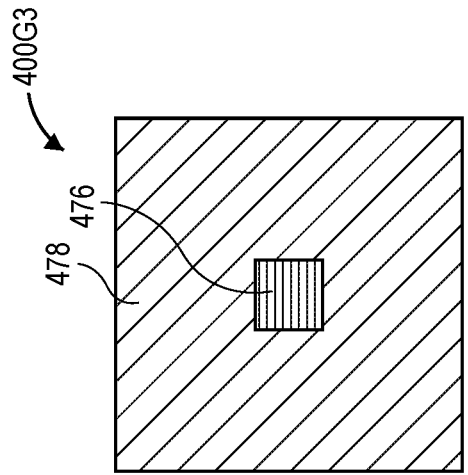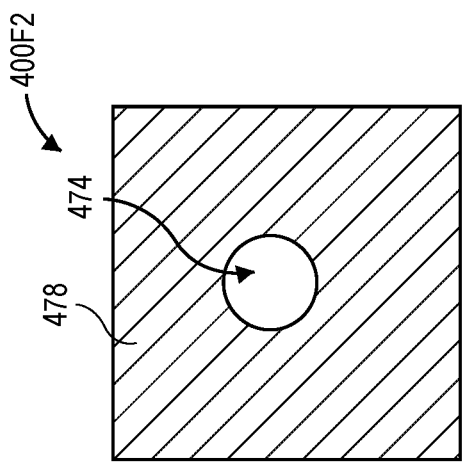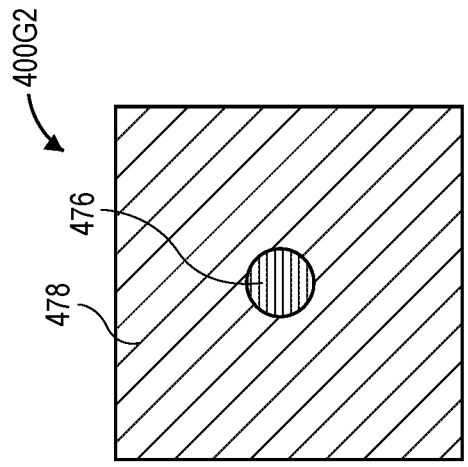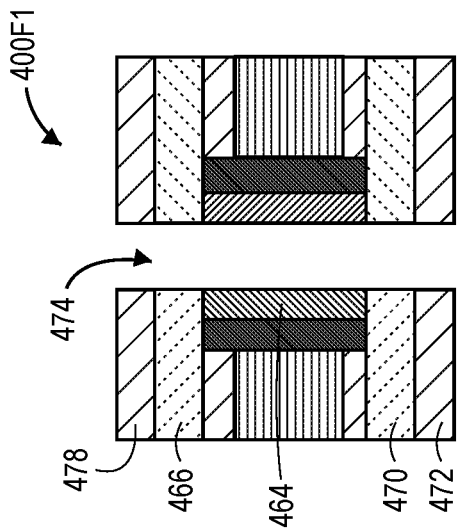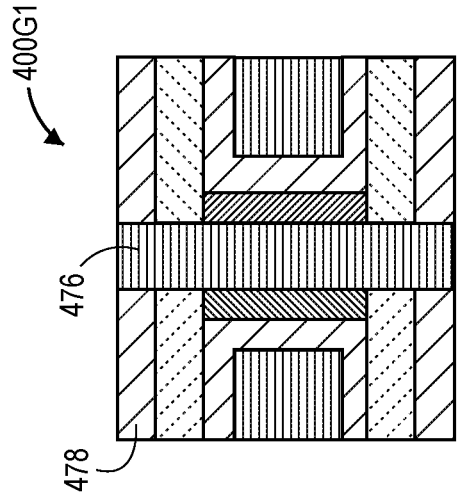
FIG. 4F
FIG. 4G

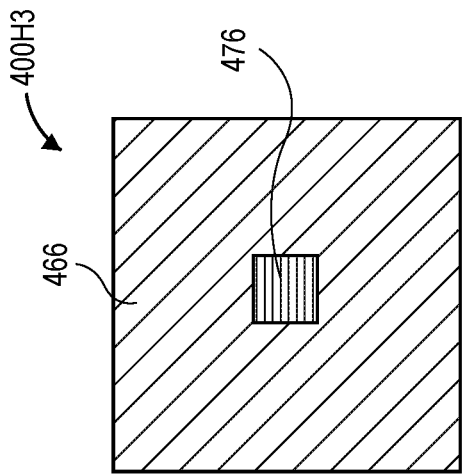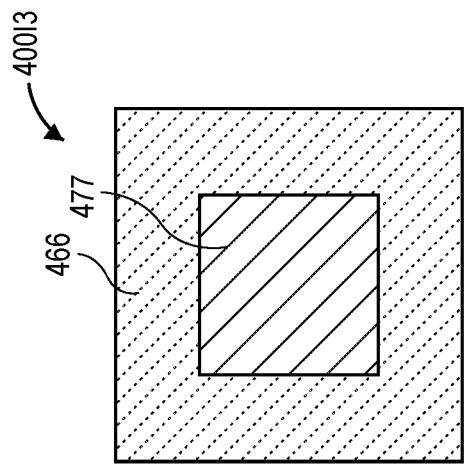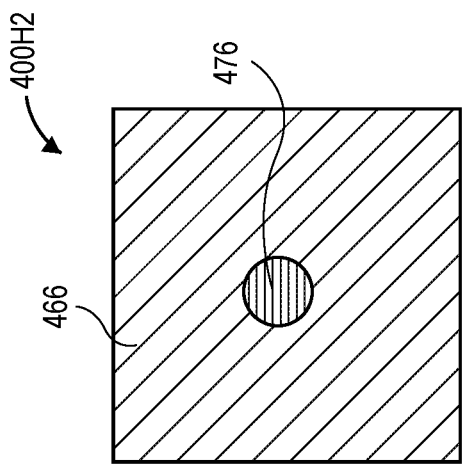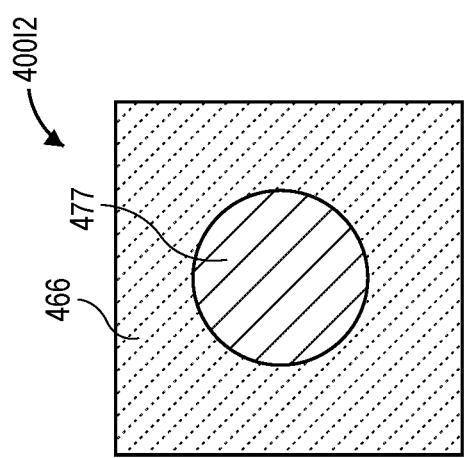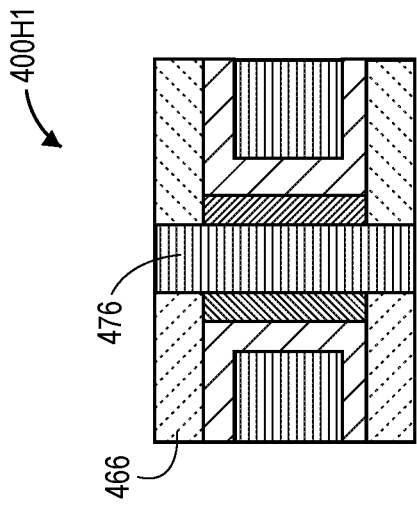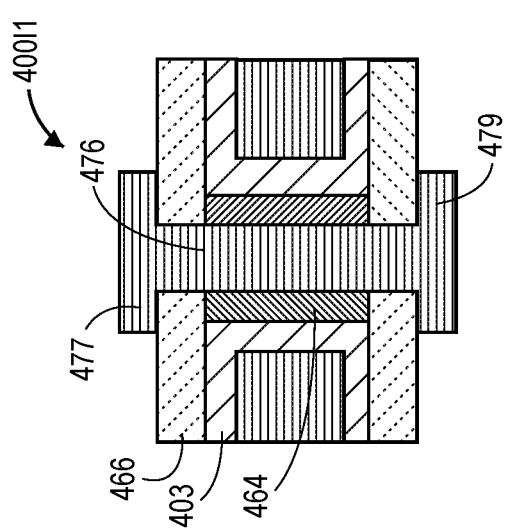
FIG. 4H
FIG. 4I

CAPACITOR IN A SUBSTRATE VIA

FIELD

Embodiments of the present disclosure generally relate to the field of package assemblies, and in particular package assemblies that include capacitors.

BACKGROUND

Continued reduction in end product size of mobile electronic devices such as smart phones and ultrabooks is a driving force for the development of reduced size system in package components.

BRIEF DESCRIPTION OF THE DRAWINGS

FIG. 4A-4I illustrate a cross section side view and various top-down views of stages in a manufacturing process for creating a capacitor in a substrate via, in accordance with various embodiments.

DETAILED DESCRIPTION

Figure 1:
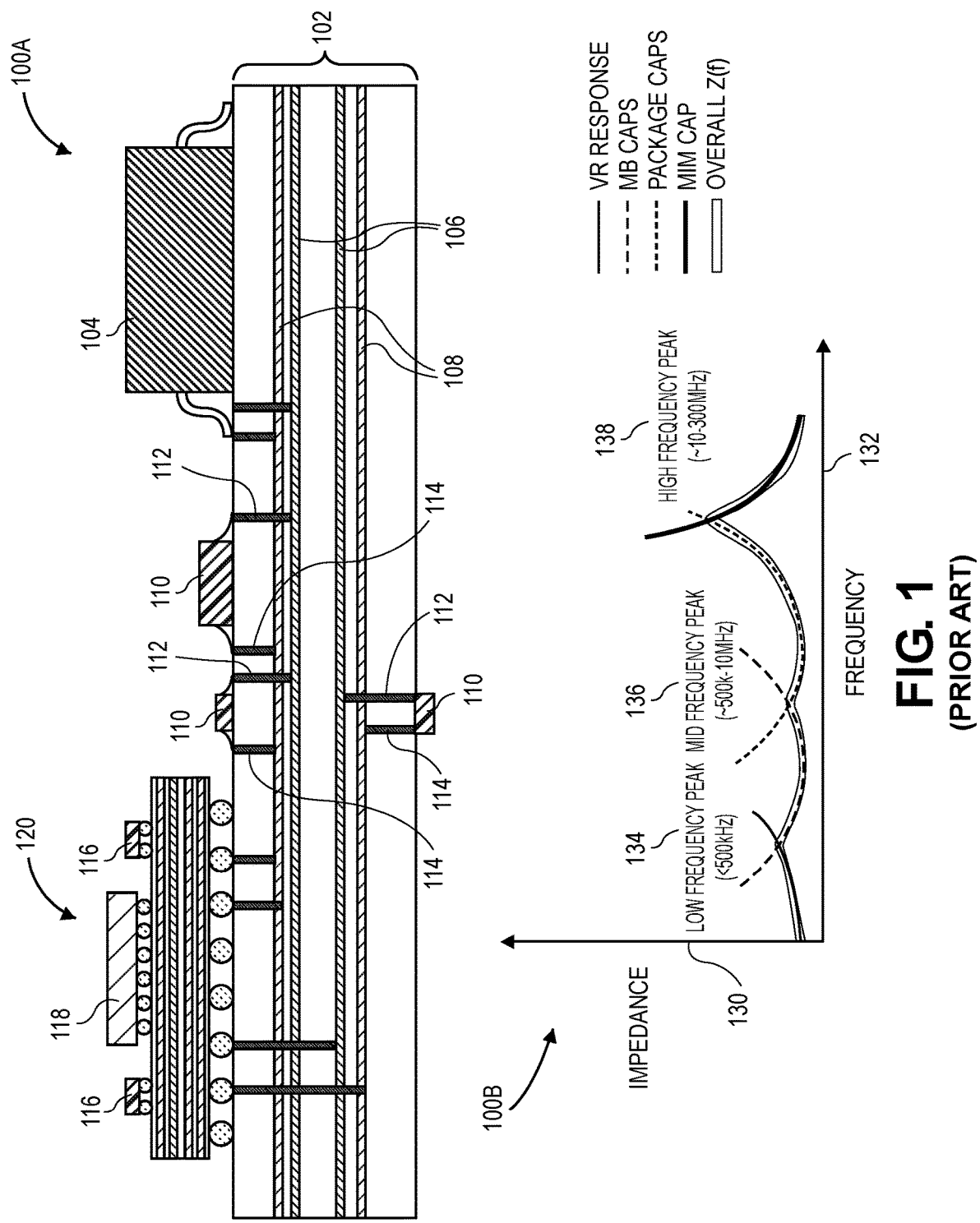
FIG. 1 illustrates a cross section side view of a legacy package that includes discrete decoupling capacitors, and an example legacy impedance versus frequency diagram for the legacy package.

Embodiments of the present disclosure may generally relate to systems, apparatus, techniques, and/or processes directed to using vias, or plated through holes (PTH), within a substrate or within a sub laminate to create capacitors. In embodiments, the capacitors may be decoupling capacitors. In embodiments, an interior of the via may have a first layer, or coating, of an electrically conductive material such as copper, on the sides of the via. A second layer of a high-k dielectric material, as compared to a dielectric constant of silicon dioxide, may then be placed on the first layer of the electrically conductive material. A third layer of electrically conductive material may then be placed on the second layer of the high-k dielectric material. In embodiments, when looking at top-down cross section, the first layer, second layer, and third layer may form concentric rings. In embodiments, these capacitors constructed within vias in a substrate may be referred to as integrated capacitors.

The third layer of electrically conductive material may then be attached to a positive plane, and the first layer of electrically conductive material, which may be referred to as a shield, may be attached to a ground (GND). In embodiments, this may be switched. In embodiments, the geometry of the capacitor, including but not limited to the width, height, and plating thickness, the number of vias within a substrate, the type of material used for the conductor, and the type of material used for the dielectric may be selected to provide a desired capacitive effect for a package. For example, embodiments may have an equivalent series inductance (ESL) of almost 10% of legacy discreet capacitors, and an equivalent series resistance (ESR) on par with the lowest ESR for discrete capacitors.

Legacy implementations of capacitors for packages use discrete component capacitors that are attached to a surface of a substrate, and may electrically couple with power planes or ground planes that may be at different layers within the substrate. Other legacy implementations of capacitors may have discrete capacitors or planar capacitors embedded within a package or a board, or may be on-die Metal-Insulator-Metal capacitors (MIMcaps) that are parallel plate capacitors formed by two metal films with the dielectric material in between.

These legacy implementations present challenges for package designers. For example, legacy surface mount discrete capacitors may have area and placement constraints on a substrate, for example large keep out zones (KOZ), cavities, heights, and/or point of load restrictions. Cavities are voids or holes on the package or board to accommodate mounting hardware or other structure like antennae. Height restrictions are keep out areas to avoid interference with heat sinks or other mechanical features. Point of load are areas where capacitors are placed as close as possible to location where power is delivered. It is preferred to place capacitors as close as possible to the point of load to efficiently delivery current.

Discrete capacitors are also susceptible to aging and temperature effects, in addition to parasitic effects that include ESR and/or ESL effects. In addition, discrete capacitors require a larger bill of materials (BOM) for a package, thereby increasing manufacturing complexity and cost.

Legacy discrete capacitors embedded in a substrate also present challenges to designers, including a limitation on the quantity of the number of discrete capacitors due to limited area. Limited space on the board or the substrate will limit the number of capacitors that can be placed in the area due the larger size of the capacitor competing with the area that is needed to place them. Also, extra manufacturing process steps required to embed the discrete capacitors, as well as the aging, temperature effects, and parasitic effects as discussed above.

Legacy planar defined capacitors within a substrate may also have challenges due to the limited number of planar defined capacitors that can be placed in an area, particularly if a large effective capacitance is required, which requires a large planar space in the substrate. In addition, legacy planar defined capacitors within routing layers may result in signal and/or power routing interference. Also, discrete capacitors in addition to legacy planar defined capacitors are typically required. Legacy on die MIMcaps have challenges of reduced die utilization of flexibility, increased die area required, as well as increase cost, reliability issues, limited capacity, and extra manufacturing complexity and cost.

Embodiments described herein, may result in smaller packages. This may occur by eliminating discrete capacitors and on die MIMcaps, or by increasing the number of dies that may be placed within a package. In addition, embodiments may reduce manufacturing assembly steps and reduce BOM content and design complexity. In addition, embodiments may enable single-sided printed circuit boards (PCB)

that no longer require discrete capacitor components on both sides of a PCB, and may also enable substrate and board cost reduction in terms of areas and the amount of material required. Area reduction may enable smaller form factor sizes, and allow a higher routing density within the substrate.

In embodiments, KOZ, cavity, and height restrictions may be reduced or eliminated, resulting in lighter weight, thinner, and/or more flexible platforms. The resulting electrical and/or functional performance of a package may be improved through higher efficiency power delivery, higher signaling speeds, higher RF performance, and the ability for the substrate to operate at a higher frequency. Embodiments are also less susceptible to reliability issues due to temperature fluctuations and aging issues found in discreet capacitors.

Embodiments described herein also provide lower-cost and smaller board designs without sacrificing system on chip (SoC) and chipset performance. Embodiments may also be applied to other board devices, for example small outline dual in-line memory modules (SoDIMM) or solid state drives (SSD) for discrete capacitor removal where density and speed is valued. Packages that include embodiments as described herein may be applicable to the mobile, desktop, and/or server environments, as well as to peripheral devices, non-computing devices such as compact disk and digital video disk players, Internet of Things (IoT) devices, as well as components such as silicon interposers. These devices may be used in the consumer, military/government, industrial, medical automotive, and/or aerospace applications.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a cross section side view of a legacy package that includes discrete decoupling capacitors, and an example legacy impedance versus frequency diagram for the legacy package. Legacy package 100A is a cross section side view that includes a substrate 102 onto which a voltage regulator module (VRM) 104 is mounted. The VRM 104 provides power to the power planes 106 within the substrate 102. Ground planes 108 are also within the substrate 102.

In these legacy implementations, discrete capacitors 110 are coupled to both sides of the substrate 102. The discrete capacitors 110 may be decoupling capacitors, used to minimize impedance response and to reduce electrical noise caused by other circuit elements in legacy package 100A. The discrete capacitors 110 use vias 112 that are filled with conductive material to electrically couple with power plane 106, and use vias 114 that are filled with conductive material to electrically couple with ground plane 108. A sub package 120 that is attached to the substrate 102 may also use capacitors 116 for voltage control for die 118. Legacy package 100A is only one example of legacy implementations, which may have tens to hundreds of discrete capacitors on the substrate 102 or within sub packages 120 depending upon the complexity of the package.

Diagram 100B shows a legacy impedance 130 versus frequency 132 diagram, from the VRM 104 to the die 118. Different curves are shown for low-frequency peak 134, mid-frequency peak 136, and high-frequency peak 138. A Power Delivery Network (PDN) impedance profile may be a good indicator of electrical power integrity performance and robustness for a package. In general, the higher the impedance magnitude (Z), the higher the expected noise (V) for a given current (I), where V=I*Z. Excessive noise can lead to functionality issues, signal integrity degradation, and system failure. In implementations it is important to manage the PDN impedance across all frequency spectrums. Discrete capacitors, for example discrete capacitors 110, 116 are used for this purpose. They are implemented on the package 120 and/or substrate 102 and in different form factors and values depending on the desired frequency response. However, these legacy implementations suffer from the challenges as described above.

Figure 2:
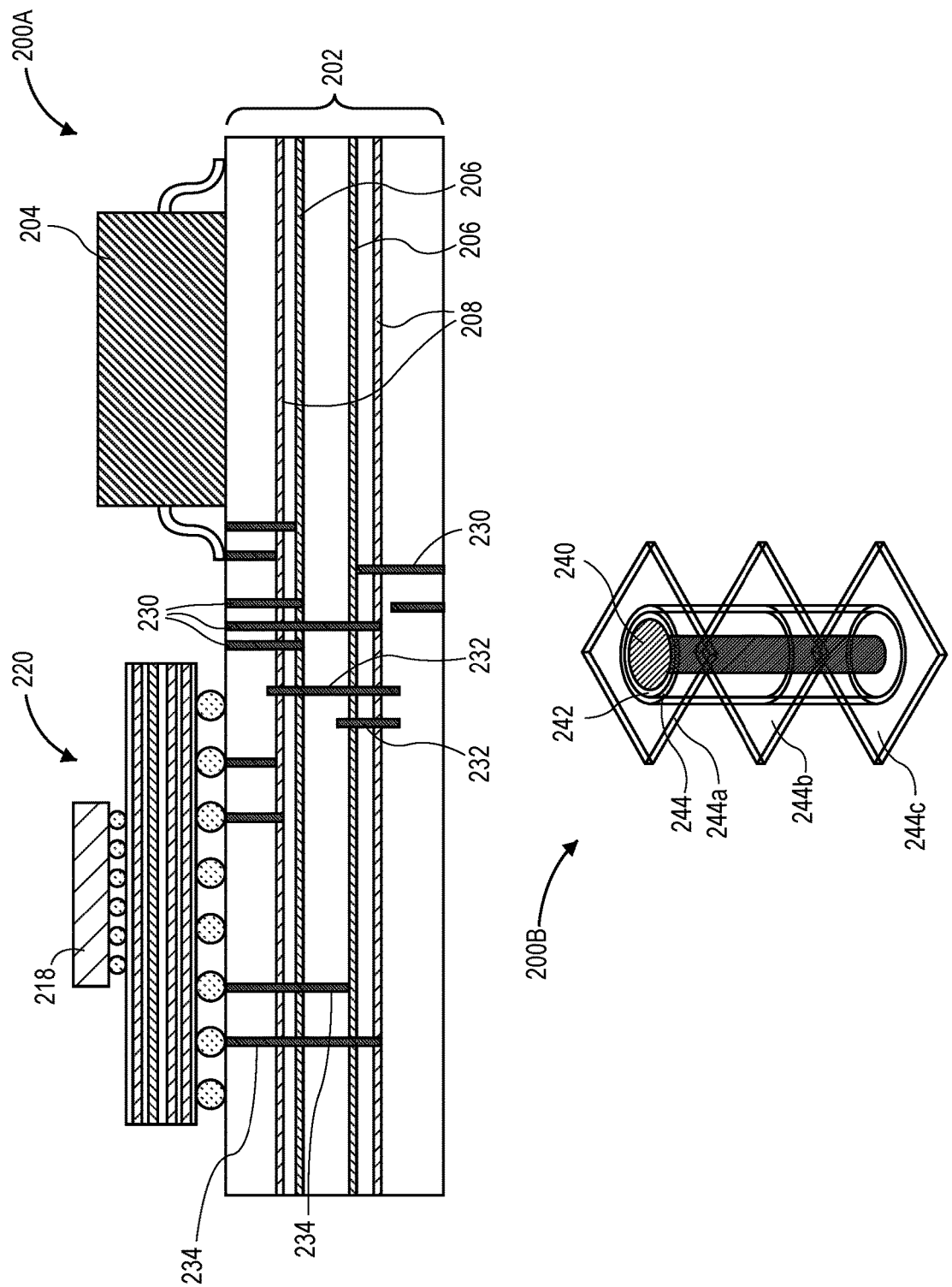
FIG. 2 illustrates a cross section side view of a package that includes capacitors within vias in a substrate, as well as perspective view of an example of a capacitor, in accordance with various embodiments.

FIG. 2 illustrates a cross section side view of a package that includes capacitors within vias in a substrate, as well as perspective view examples of a capacitor, in accordance with various embodiments. Package 200A, which may be similar to package 100A of FIG. 1, includes a substrate 202, a VRM 204, and power planes 206 and ground planes 208 within substrate 202, which may be similar to substrate 102, VRM 104, power planes 106 and ground planes 108 of FIG. 1. In embodiments, the substrate 202 may be a glass substrate or include one or more layers of glass. In embodiments, techniques for creating vias through layers of glass is discussed in greater detail with respect to FIG. 6.

In embodiments, via capacitors 230 extend from a surface of the substrate 202 and electrically couple with one or more power planes 206 and one or more ground planes 208. In embodiments, some embedded via capacitors 232 may be formed within the substrate 202, during the buildup process of the substrate 202. These embedded via capacitors 232 may not have electrical contacts at a surface of the substrate 202. In other embodiments, via capacitors 234 may electrically couple with one or more power planes 206 and one or more ground planes 208 to provide stable power to the package 220 and the die 218. The package 220, unlike legacy package 120 and die 118 of FIG. 1, do not include any discrete capacitors.

Via capacitor 200B shows a perspective view that may be similar to via capacitors 230, 232, 234. A center conductive metal 240, which may include copper, is surrounded by a dielectric material 242. In embodiments, the dielectric material 242 may be a high-k dielectric material that includes material shown with respect to Table 1, that includes Titanium Oxide (TiO2), graphene oxide (GO), and reduced graphene oxide (RGO).

TABLE 1

Frequency-Dependent εr Values for TiO2, TiO2/GO and TiO2/RGO Dielectric Constant (εr)

| Frequency (HZ) | TiO2 nano sheet | TiO2/GO | TiO2/RGO |
|---|---|---|---|
| 20 | 4.81 × 102 | 9.24 × 102 | 9.14 × 106 |
| 100 | 2.18 × 102 | 2.77 × 102 | 9.80 × 104 |
| 1 × 103 | 6.71 × 101 | 6.93 × 101 | 6.09 × 103 |
| 1 × 104 | 1.25 × 101 | 2.45 × 101 | 2.03 × 103 |
| 1 × 105 | 3.20 | 1.12 × 101 | 1.32 × 103 |
| 1 × 106 | 1.70 | 6.70 | 4.57 |

In embodiments, the dielectric material 242 may be surrounded by an outer conductive metal 244, which may also include copper. In embodiments, the center conductive metal 240 and the outer conductive metal 244 may include different materials. In embodiments, the center conductive metal 240 may be coupled with a power source, such as power planes 206, and the outer conductive metal 244 may be coupled with a ground such as ground plane 208. Note that the outer conductive metal 244 may intersect with various ground planes, or other metal layers 244a, 244b, 244c, depending on the location of the via capacitor 200B within the substrate 202.

Although the center conductive metal 240 is shown as round, which is a common shape when vias are formed through a substrate 202 using drilling, a variety of different shapes may be used. In other embodiments, the center conductive metal 240 may have an oblong or trench shape when viewed from the top down. These different shapes may be accomplished by a series of via drills that are made next to each other, which may be in a line that is straight or curved. In other embodiments, the different shapes of the center conductive metal 240, from a top-down view, may be a square, rectangle, ellipse, oblong, or an irregular shape. In some embodiments, the center conductive metal 240 may include another high-k dielectric (not shown) within the center conductive metal 240. Other characteristics of via capacitor 200B may be altered, such as the length of the via, the width of the via, materials used for the dielectric and/or conductive metals, and the thickness of the various layers.

In embodiments, the existing geometries of vias may be used to create via capacitors. In embodiments, a capacitor value can be optimized by changing the via geometry or the drill geometry, changing plating characteristics or a plating process, and varying the high-k epoxy material to achieve precise capacitance and higher value.

Figure 3:
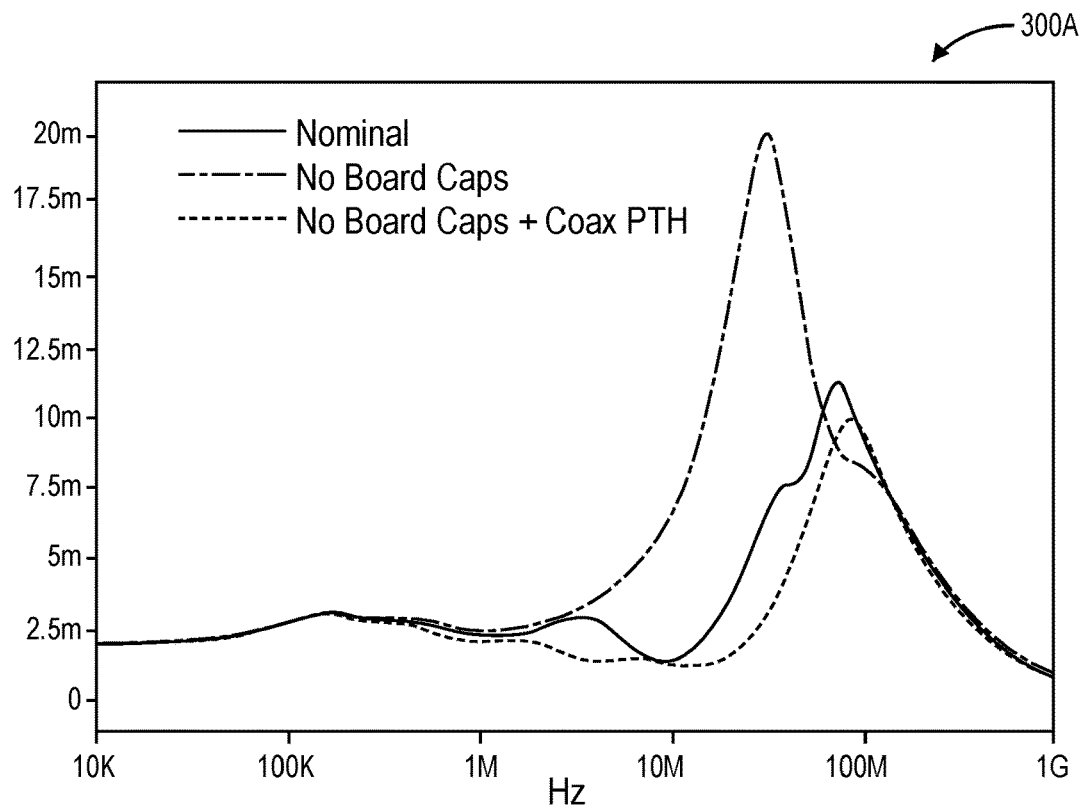
FIG. 3 illustrates graphs that compare the performance of legacy discrete capacitors in comparison with capacitors in a substrate via, in accordance with various embodiments.
Figure 3:
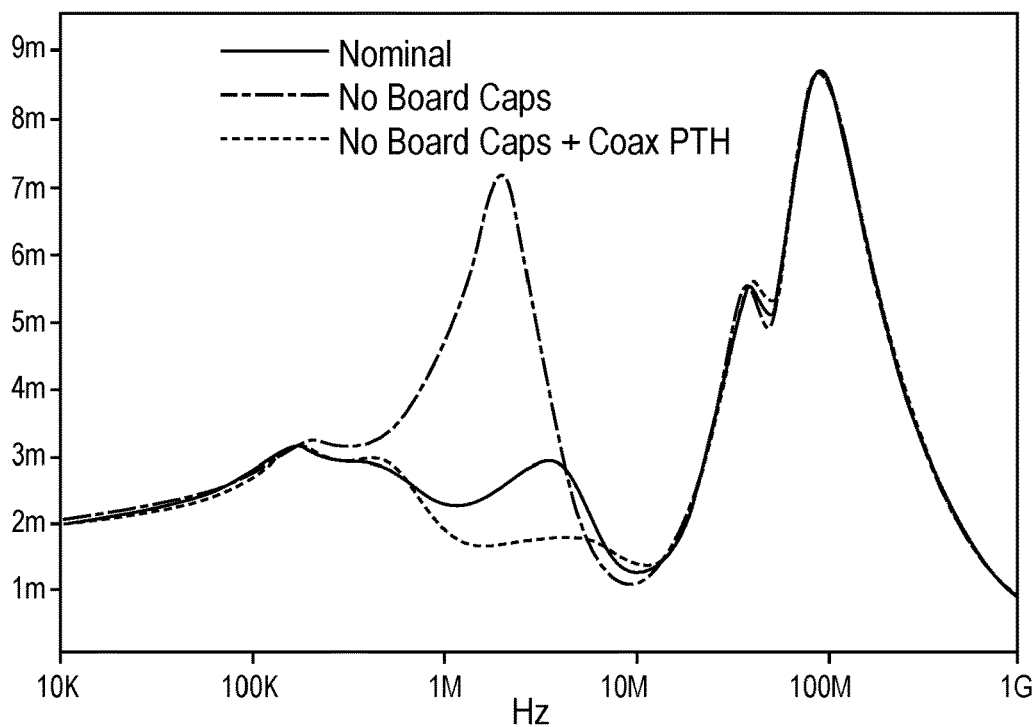

FIG. 3 illustrates graphs that compare the performance of legacy discrete capacitors in comparison with capacitors in a substrate via, in accordance with various embodiments. In embodiments, by varying the thickness of the high-k material, material properties, and length of the via capacitor such as via capacitor 200B of FIG. 2, a capacitance value that is near that of discrete capacitors may be achieved as shown in Table 2 below. Note that the high-k dielectric material may be an advanced material, such as titanium dioxide, that has a very high εr value, which is a dielectric constant of the dielectric material being used.

Simulations were performed using a client power delivery system and replacing the legacy discrete capacitors with via capacitors. The last two rows in Table 2 represent a typical package and board via dimensions. Parasitics, for example parasitic inductance and/or resistance, were placed in a standard Vccin Z(f) model in place of discrete package and board capacitors to look at the effects on the power delivery system. The legacy package capacitor solution was as follows: 17×0204 1 uF, 8×0402 1 uF, and 25×01005 100 nF for a total of ~27.5 uF. These legacy capacitors were removed and replaced with 216 via capacitors for a total of ~54 uF. When these legacy discrete capacitors are replaced with via capacitors, there is an improvement in the mid to high-frequency response, ~1-50 MHz, as the via capacitors are closer in proximity to the load, as well as showing an overall higher capacitance than the discrete capacitor solution. These results can be seen in diagram 300A and 300B.

TABLE 2

Parasitics with varying via dimensions and material.

| | Core Thickness | Material εr | Rac | Lac | C |
|---|---|---|---|---|---|
| 150 um PTH, 200 um high-k material thickness | 1.05 mm | 2000 | 142 mOhm | 42 pH | 91 pF |
| 250 um PTH, 10 um high-k material thickness | 1.05 mm | 2000 | 17 mOhm | 4.8 pH | 1.02 nF |
| 250 um PTH, 10 um high-k | 1.05 mm | 1000000 | 7 mOhm | 11 pH | 0.5 uF |

TABLE 2-continued

Parasitics with varying via dimensions and material.

| | Core Thickness | Material εr | Rac | Lac | C |
|---|---|---|---|---|---|
| material thickness 250 um PTH, 10 um high-k material thickness | 0.740 mm (client package) | 1000000 | 3 mOhm | 6 pH | 0.25 uF |
| 250 um PTH, 10 um high-k material thickness | 1.6 mm (client board) | 1000000 | 4 mOhm | 19 pH | 0.8 uF |

Diagrams 300A and 300B show a comparison of the effective impedance versus frequency of the power delivery circuit with no decoupling capacitors versus discrete board capacitors versus via capacitors. Lower impedance is desired. In the case of via capacitors, the impedance is equal to or lower than the board with board discrete capacitors and significantly lower than the case with no board capacitors or via capacitors. The peaks show the highest impedance at a particular frequency. Diagram 300A includes a comparison with capacitors replaced on the package only while diagram 300B includes a comparison of capacitors replaced only on the board. For the same core power rail, the legacy capacitor solution for the board was as follows: 15×0402 10 uF, 12×0603 22 uF for a total of ~414 uF (4×220 uF 7343 bulk capacitors were not removed/replaced). The other legacy capacitors were removed and replaced with 180 via capacitors for a total of ~150 uF. When these legacy discrete capacitors are replaced with via capacitors, there is improvement in the mid-frequency response, ~1-10 MHz, as the PTH capacitors are closer in proximity to the load with less inductance.

Diagram 300A and diagram 300B show the benefits of via capacitors in the mid to high frequency Z(f) response. In embodiments, further improvement can be achieved when the package and board designs are optimized for via capacitors instead of legacy discrete capacitor solutions. In one example, a design may be optimized and form factor reduced by placing via capacitors closer to the load.

FIG. 4A-4I illustrate a cross section side view and various top-down views of stages in a manufacturing process for creating a capacitor in a substrate via, in accordance with various embodiments. These stages may be performed using the processes, systems, and/or techniques described herein and particularly with respect to FIGS. 1-3.

Figure 4A:
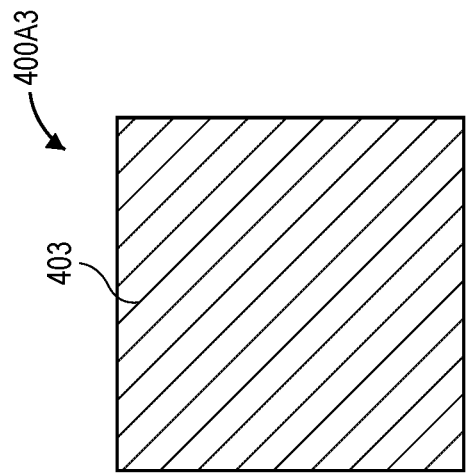
Figure 4A:
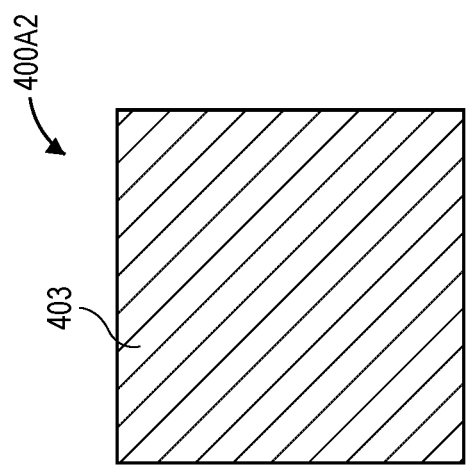
Figure 4A:
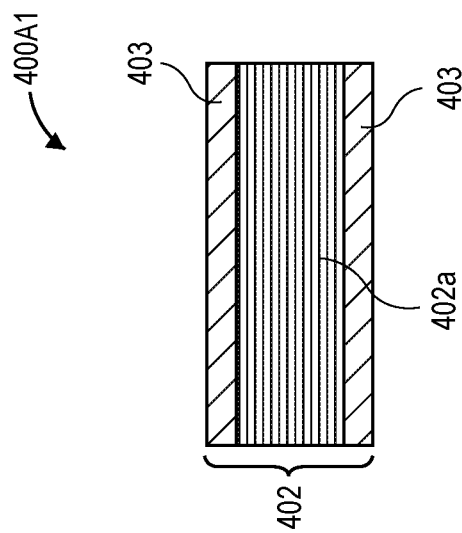

FIG. 4A shows a stage in the manufacturing process that includes package 400A1 which is a cross section side view of a substrate 402 that includes conductive layers 403. Substrate 402 may be a single layer, or may include multiple layers, for example inner layers 402a. In embodiments, the layers may be dielectric layers and/or metal layers. In embodiments, the conductive layers 403 may be a metal layer that electrically couples with a ground plane or with a power plane (not shown). Packages 400A2 and 400A3 show a top-down view of package 400A1.

Figure 4B:
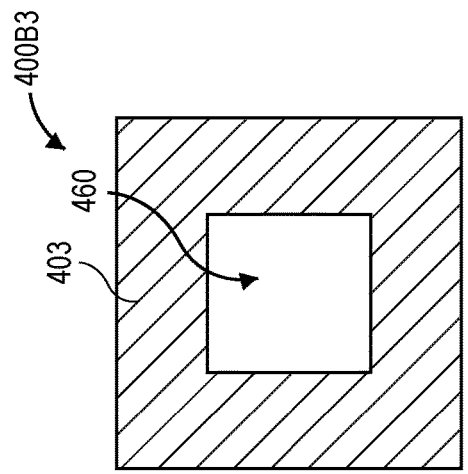
Figure 4B:
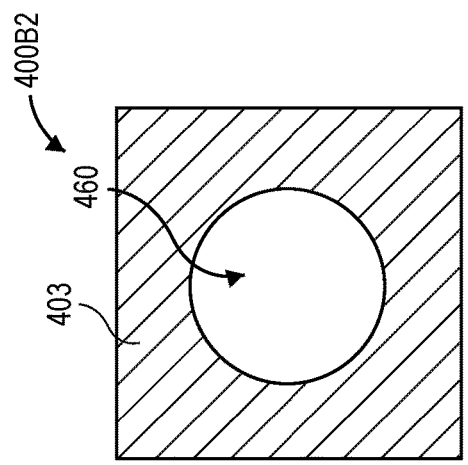
Figure 4B:
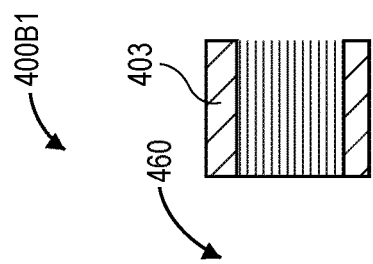
Figure 4B:
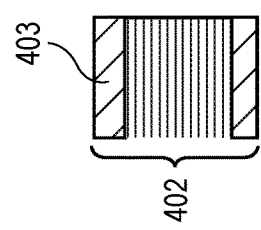

FIG. 4B shows a stage in the manufacturing process that includes package 400B1 which is a cross section side view that includes a via 460 that is drilled into the substrate 402. In embodiments, the via 460 is drilled using laser or mechanical drilling techniques. Package 400B2 shows a top-down view where the via 460 has been traditionally drilled in a circular shape, where package 400B3 shows a top-down view where the via 460 is drilled in a square shape.

It should be noted that a circular and a square shape are shown here, a via of any shape may be formed.

Figure 4C:
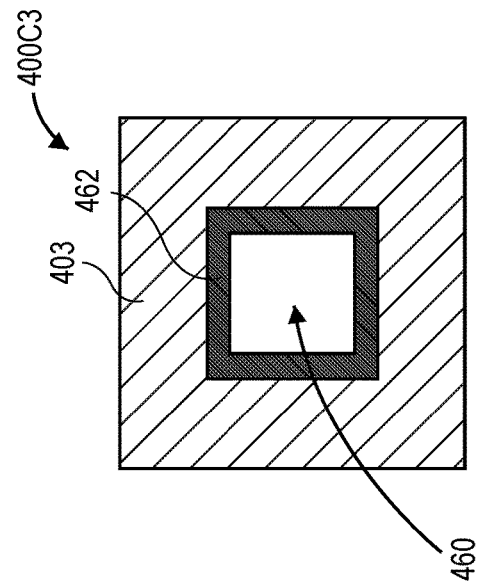
Figure 4C:
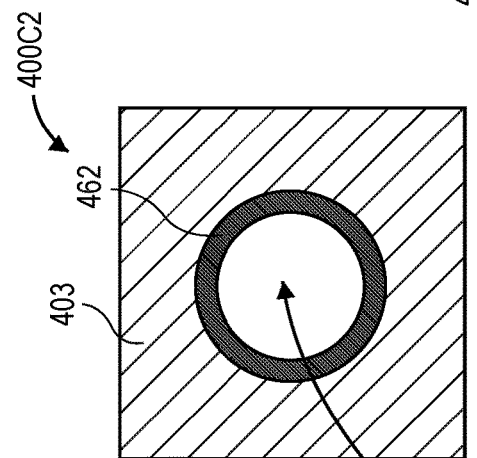
Figure 4C:
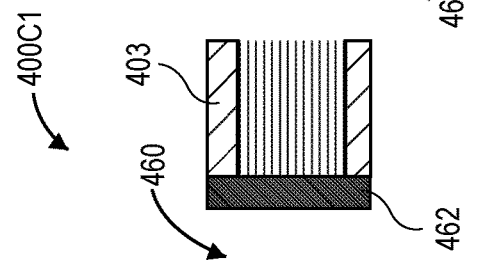
Figure 4C:
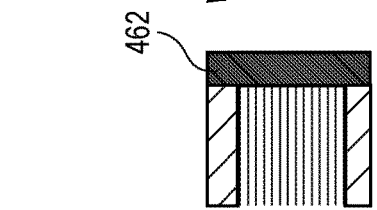

FIG. 4C shows a stage in the manufacturing process that includes package 400C1 where a conductive metal 462 is formed on the edges of the via 460. In embodiments, the conductive metal 462 may be similar to the outer conductive metal 244 described with respect to capacitor 200B of FIG. 2B. Conductive metal 462 may be formed using a plating process that may be used during a PTH process, or may be applied using an electro plating process. In embodiments, the conductive metal 462 may include copper. Package 400C2 shows an embodiment of a top-down view where the conductive metal 462 forms a ring shape. Package 400C3 shows an embodiment of a top-down view where the conductive metal 462 forms a square shape.

Figure 4D:
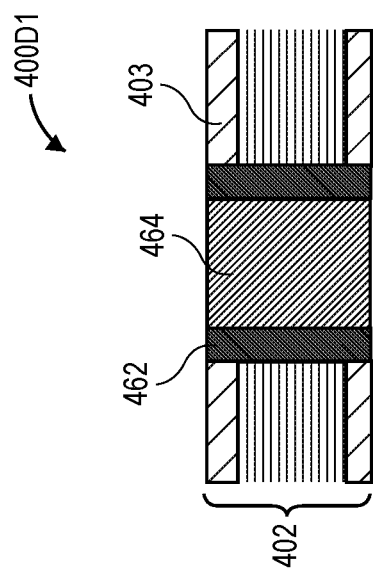
Figure 4D:
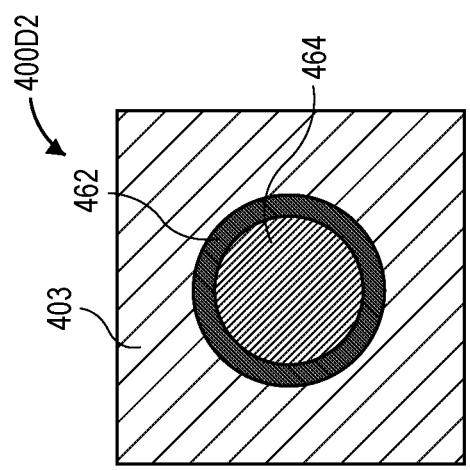
Figure 4D:
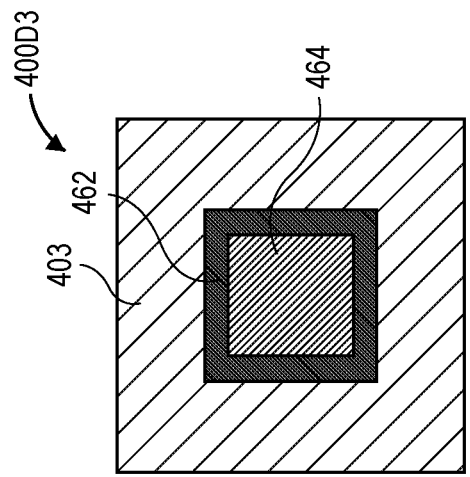

FIG. 4D shows a stage in the manufacturing process that includes package 400D1, where a dielectric 464 is formed inside the conductive metal 462. In embodiments, the dielectric 464 may be applied by pouring the material onto the substrate 402 and using a squeegee to force and/or flow the material into the via 460. In embodiments, the dielectric 464 may be a high-k dielectric, and may also be an epoxy. Package 400D2 shows an embodiment of a top-down view where the dielectric 464 forms a circular shape. Package 400D3 shows an embodiment of a top-down view where the dielectric 464 forms a square shape.

Figure 4E:
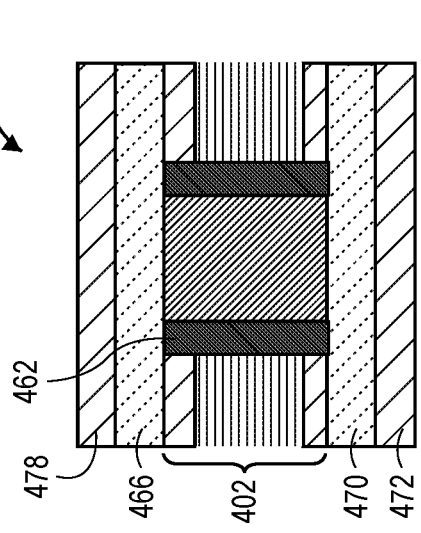
Figure 4E:
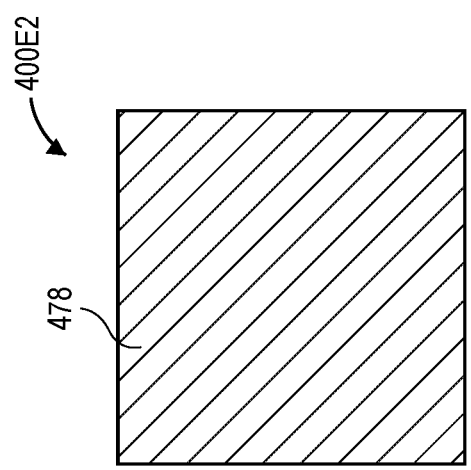
Figure 4E:
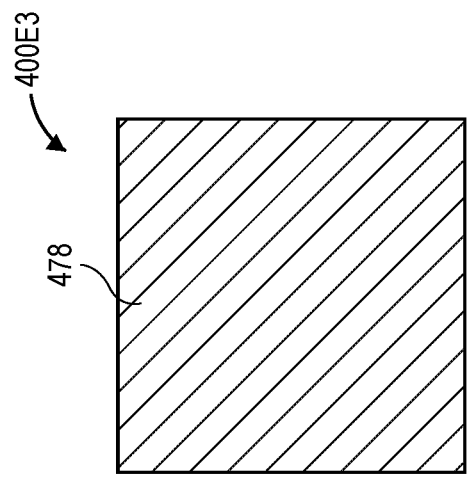

FIG. 4E shows a stage in the manufacturing process that includes package 400E1, where prepeg and laminate layers 466, 470 are applied on either side of the substrate 402. In embodiments, prepeg is a type of base material, fiberglass or fabric that has been pre-impregnated or reinforced with resin, typically epoxy, or polyimide that is partially cured. In embodiments, thinner prepeg and laminate layers 466, 470 may be preferred because they are less lossy and more suited for highspeed designs. Foil layers 478, 472, which may include copper foil, may be applied on the outside of the prepeg and laminate layers 466, 470. Packages 400E2 and 400E3 show embodiments of a top-down view where the top foil layer 478 is shown.

FIG. 4F shows a stage in the manufacturing process that includes package 400F1, where another via 474 is drilled through the dielectric 464. The via 474 may be used to subsequently form a capacitor electrode. In embodiments, the other via 474 may be drilled using laser or mechanical techniques. Packages 400F2, 400F3 show a top-down view of embodiments of a shape of the other via 474, including circular and square.

FIG. 4G shows a stage in the manufacturing process that includes package 400G1, where a conductive material 476 is placed within the via 474. In embodiments, the conductive material 476 may be similar to the center conductive metal 240 of capacitor 200B of FIG. 2. Packages 400G2, 400G3 show a top-down view of a shape of the conductive material 476, including circular and square.

FIG. 4H shows a stage in the manufacturing process that includes package 400H1, where the foil layers 478, 472 have been stripped away and the package planarized, exposing conductive material 476. Packages 400H2, 400H3 show a top-down view of a shape of the conductive material 476, including circular and square.

FIG. 4I shows a stage in the manufacturing process that includes package 400I1, where pads 477, 479 are placed on either side of the conductive material 476. In embodiments, a metal layer (not shown) may be applied on either side of the package 400I1, with a subsequent etch process applied to define the pads 477, 479. Packages 400I2, 400I3 show a top-down view of pad 477, including circular and square.

It should be noted that in other embodiments, the conductive material 476 may further include a dielectric inside (not shown). The dielectric may be a high-k dielectric to improve capacitive performance. In embodiments, the dielectric (not shown) may be created either by drilling the conductive material 476 after the stage of FIG. 4H. In other embodiments, the dielectric (not shown) may be created by plating the conductive material 476 in the stage of FIG. 4H, leaving a hole in the center of the plated conductive material 476 which is subsequently filled with dielectric material.

Figure 5:
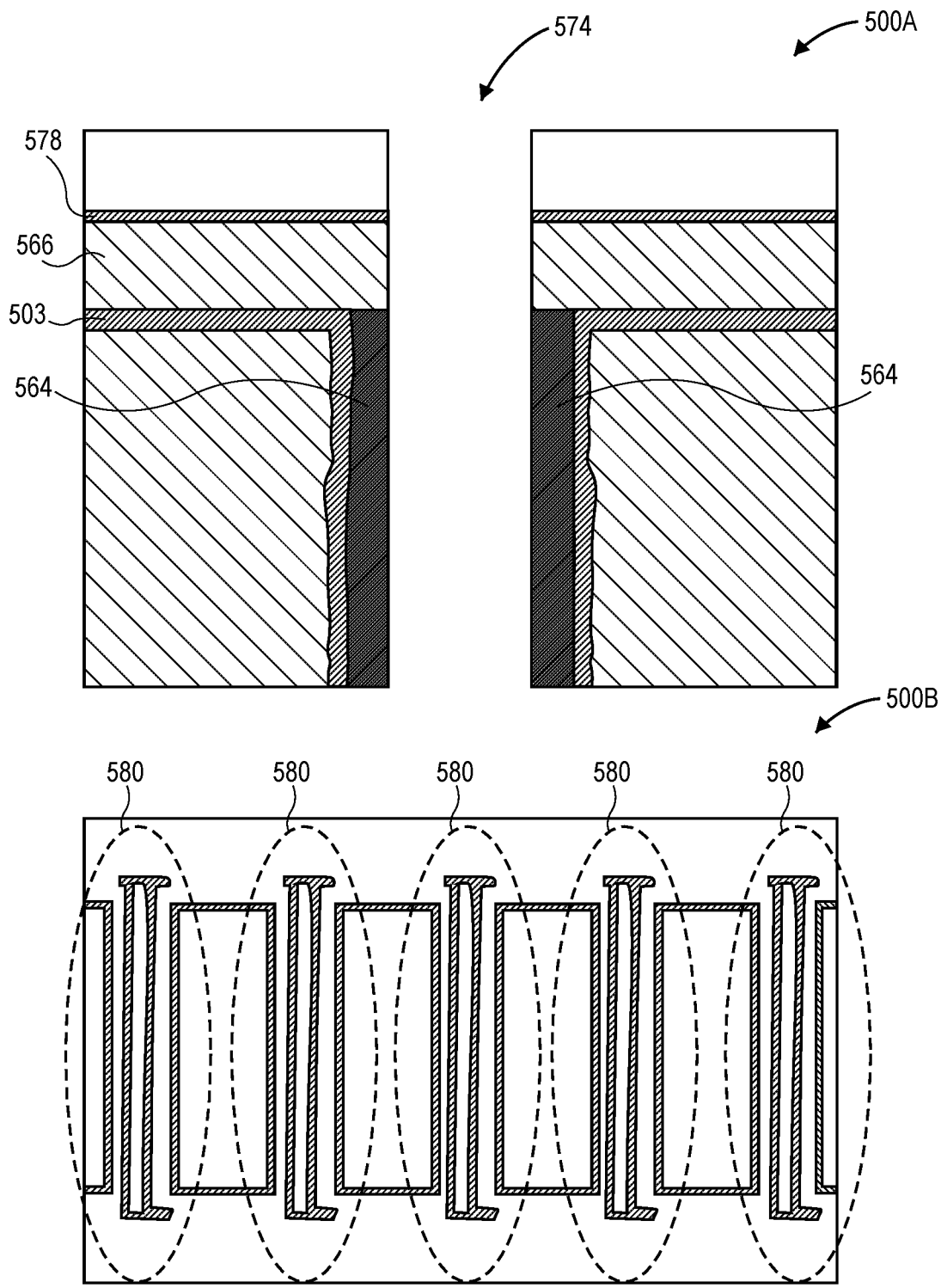
FIG. 5 shows images of cross section views of various capacitors that are within a substrate via, in accordance with various embodiments.

FIG. 5 shows images of cross section views of various capacitors that are within a substrate via, in accordance with various embodiments. Diagram 500A shows an example cross section side view of package 400F1 of FIG. 4F, with the via 574 that extends through the foil layer 578, the prepeg and laminate layers 566, the top conductive layer 503, and the dielectric 564, which may be similar to foil layer 478, prepeg and laminate layer 466, conductive layers 403, and dielectric 464 of FIGS. 4A-4I.

Diagram 500B shows an example cross section side view of a plurality of via capacitors 580, which may be similar to via capacitors 200B of FIG. 2. In embodiments, the via capacitors 580 may be arranged in any configuration on a substrate, such as substrate 202 of FIG. 2.

Figure 6:
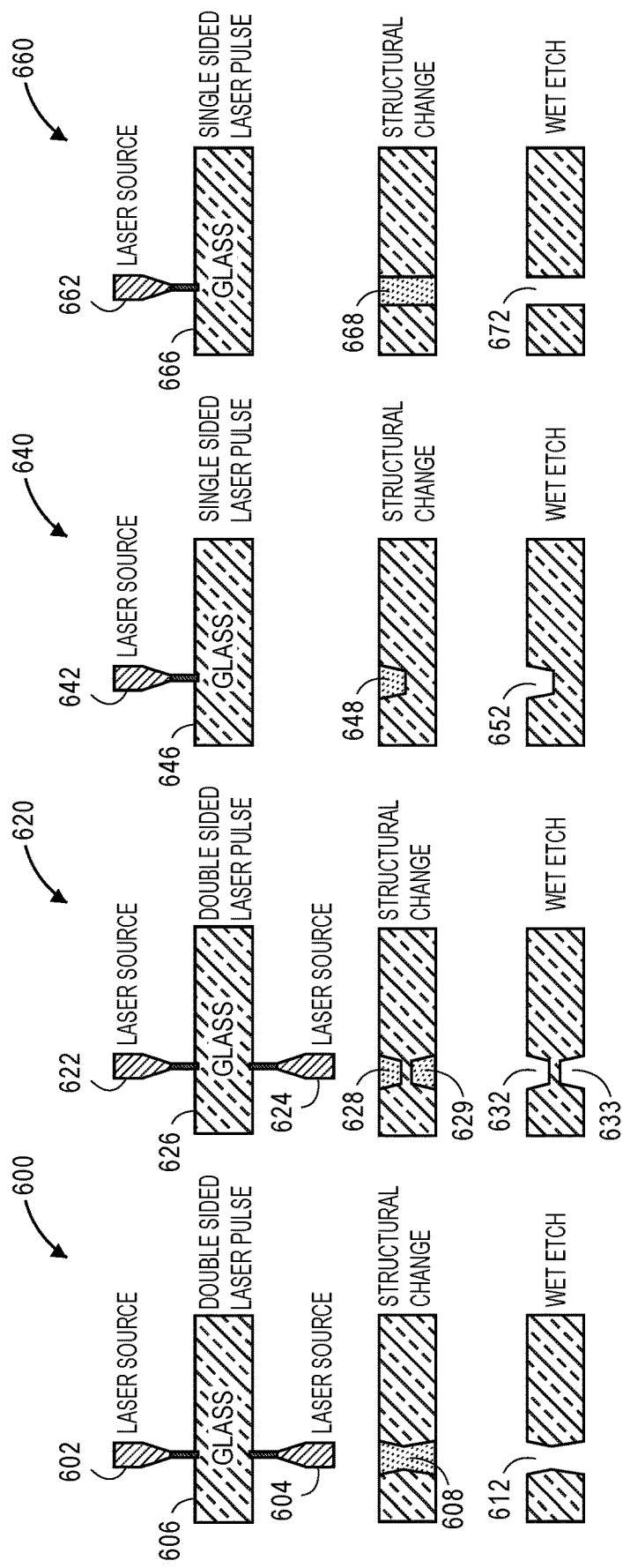
FIG. 6 illustrates multiple examples of laser-assisted etching of glass interconnects processes, in accordance with embodiments.

FIG. 6 illustrates multiple examples of laser-assisted etching of glass interconnects processes, in accordance with embodiments. FIG. 6 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the bridge discussed herein, may also take advantage of these techniques.

Diagram 600 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 612 is created by laser pulses from two laser sources 602, 604 on opposite sides of a glass wafer 606. As used herein, a through drill and a through via refers to when the drill or the via starts on one side of the glass/substrate and ends on the other side. A blind drill and a blind via refers to when the drill or the via starts on the surface of the substrate and stops half way inside the substrate. In embodiments, the laser pulses from the two laser sources 602, 604 are applied perpendicularly to the glass wafer 606 to induce a morphological change 608, which may also be referred to as a structural change, in the glass that encounters the laser pulses. This morphological change 608 includes changes in the molecular structure of the glass to make it easier to etch out (remove a portion of the glass). In embodiments, a wet etch process may be used.

Diagram 620 shows a high level process flow for a double blind shape. A double blind shape 632, 633 may be created by laser pulses from two laser sources 622, 624, which may be similar to laser sources 602, 604, that are on opposite sides of the glass wafer 626, which may be similar to glass wafer 606. In this example, adjustments may be made in the laser pulse energy and/or the laser pulse exposure time from the two laser sources 622, 624. As a result, morphological changes 628, 629 in the glass wafer 626 may result, with these changes making it easier to etch out portions of the glass. In embodiments, a wet etch process may be used.

Diagram 640 shows a high level process flow for a single-blind shape, which may also be referred to as a trench. In this example, a single laser source 642 delivers a laser pulse to the glass wafer 646 to create a morphological change 648 in the glass wafer 646. As described above, these morphological changes make it easier to etch out a portion of the glass 652. In embodiments, a wet etch process may be used.

Diagram 660 shows a high level process flow for a through via shape. In this example, a single laser source 662 applies a laser pulse to the glass wafer 666 to create a morphological change 668 in the glass wafer 666, with the change making it easier to etch out a portion of the glass 672. As shown here, the laser pulse energy and/or laser pulse exposure time from the laser source 662 has been adjusted to create an etched out portion of the glass 672 that extends entirely through the glass wafer 666.

With respect to FIG. 1, although embodiments show laser sources 602, 604, 622, 624, 642, and 662 as perpendicular to a surface of the glass wafer 606, 626, 646, and 666, in embodiments, the laser sources may be positioned at an angle to the surface of the glass, with pulse energy and/or pulse exposure time variations in order to cause a diagonal via or a trench, or to shape the via, such as 612, 672, for example to make it cylindrical, tapered, or include some other feature. In addition, varying the glass type may also cause different features within a via or a trench as the etching of glass is strongly dependent on the chemical composition of the glass.

In embodiments using the process described with respect to FIG. 6, through hole vias 612, 672 may be created that are less than 10 μm in diameter, and may have an aspect ratio of 40:1 to 50:1. As a result, a far higher density of vias may be placed within the glass and be placed closer to each other at a fine pitch. In embodiments, this pitch may be 50 μm or less. After creating the vias or trenches, a metallization process may be applied in order to create a conductive pathway through the vias or trenches, for example a plated through hole (PTH). Using these techniques, finer pitch vias will result in better signaling, allowing more I/O signals to be put through the glass wafer and to other coupled components such as a substrate.

Figure 7:
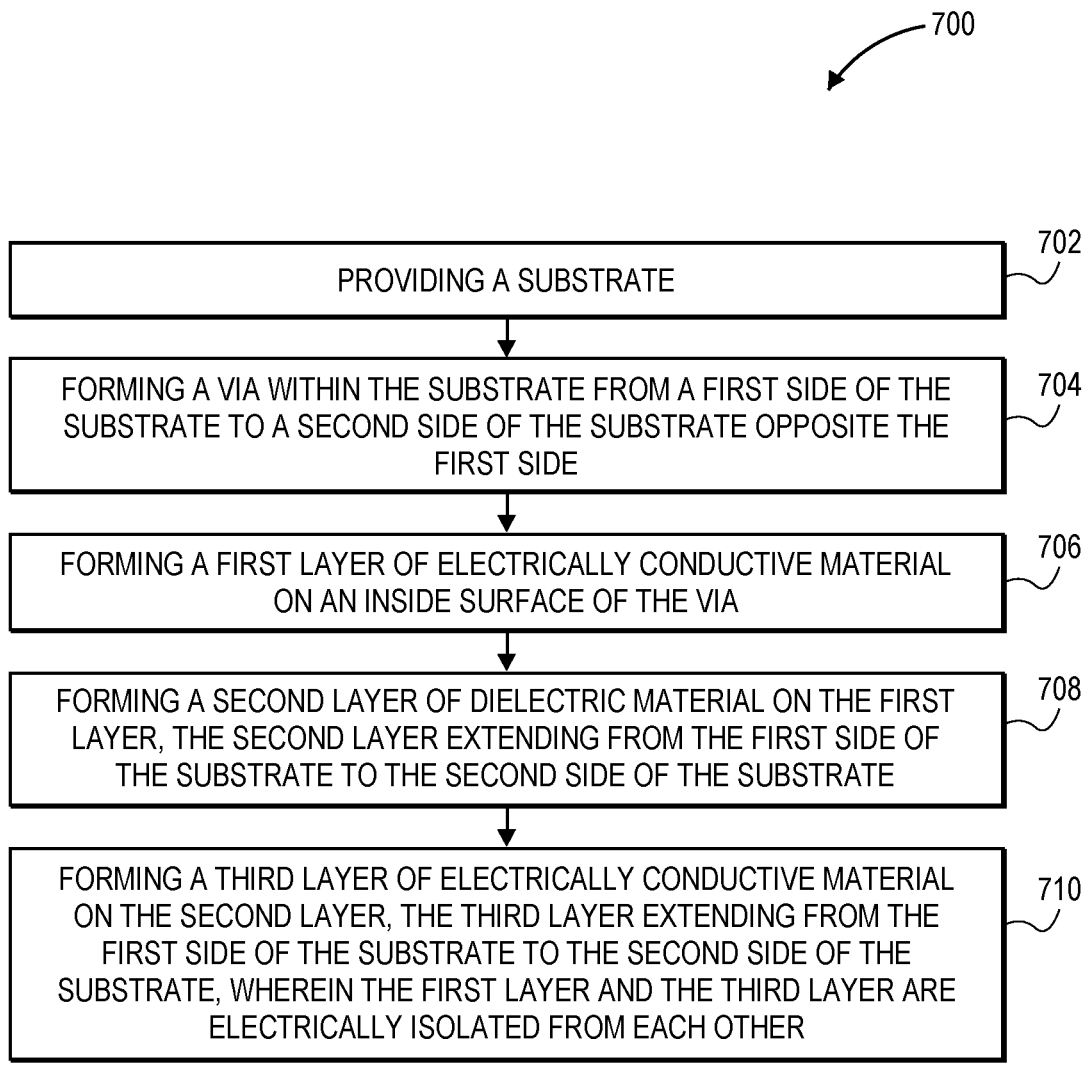
FIG. 7 illustrates an example of a process for creating capacitors in a via in a substrate, in accordance with various embodiments.

FIG. 7 illustrates an example of a process for creating capacitors in a via in a substrate, in accordance with various embodiments. Process 700 may be performed by one or more elements, techniques, or systems that may be described herein, and in particular with respect to FIGS. 1-6.

At block 702, the process may include providing a substrate.

At block 704, the process may further include forming a via within the substrate from a first side of the substrate to a second side of the substrate opposite the first side.

At block 706, the process may further include forming a first layer of electrically conductive material on an inside surface of the via.

At block 708, the process may further include forming a second layer of dielectric material on the first layer, the second layer extending from the first side of the substrate to the second side of the substrate.

At block 710, the process may further include forming a third layer of electrically conductive material on the second layer, the third layer extending from the first side of the substrate to the second side of the substrate, wherein the first layer and the third layer are electrically isolated from each other.

Figure 8:
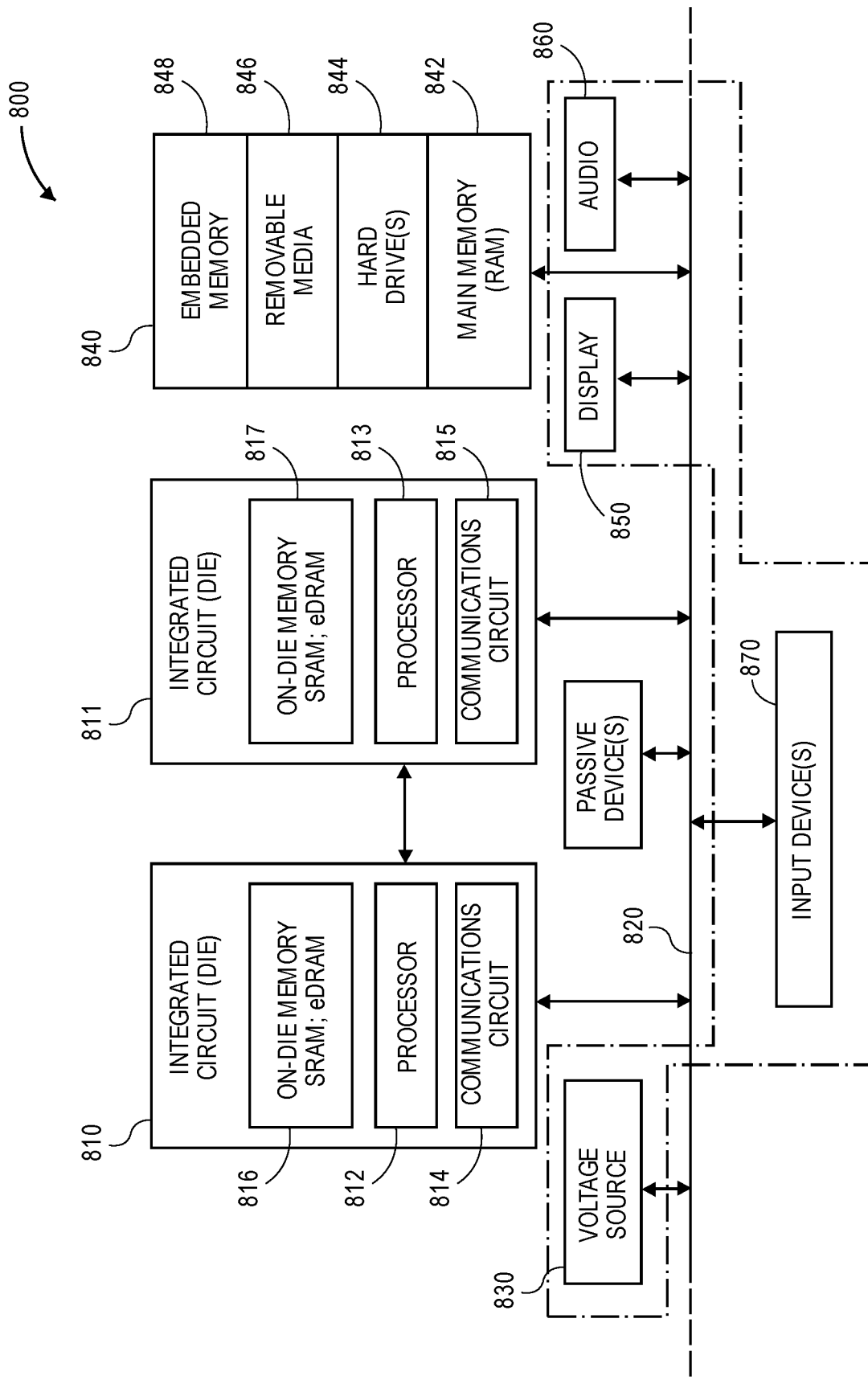
FIG. 8 schematically illustrates a computing device, in accordance with embodiments.

FIG. 8 is a schematic of a computer system 800, in accordance with an embodiment of the present invention. The computer system 800 (also referred to as the electronic system 800) as depicted can embody capacitors in a substrate via, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, capacitors in a substrate via, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having capacitors in a substrate via, according to any of the several disclosed embodiments and their equivalents, an electronic system, a computer system, one or more methods of fabricating an integrated circuit, and one or more methods of fabricating an electronic assembly that includes a package substrate having capacitors in a substrate via, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having capacitors in a substrate via embodiments and their equivalents. A foundation substrate may be included, as represented by the dashed line of FIG. 8. Passive devices may also be included, as is also depicted in FIG. 8.

Examples

The following paragraphs describe examples of various embodiments.

Example 1 is a capacitor comprising: a substrate with a first side and a second side opposite the first side; a via extending from the first side of the substrate to the second side of the substrate; a first layer of electrically conductive material on an inside surface of the via, the first layer extending from the first side of the substrate to the second side of the substrate; a second layer of dielectric material on the first layer, the second layer extending from the first side of the substrate to the second side of the substrate; a third layer of electrically conductive material on the second layer, the third layer extending from the first side of the substrate to the second side of the substrate; and wherein the first layer and the third layer are electrically isolated from each other.

Example 2 includes the capacitor of example 1, or of any other example or embodiment described herein, wherein the first layer, the second layer, and the third layer are substantially perpendicular to the first side of the substrate.

Example 3 includes the capacitor of example 1, or of any other example or embodiment described herein, wherein the substrate includes a layer of glass.

Example 4 includes the capacitor of example 1, or of any other example or embodiment described herein, wherein the dielectric material is a high-k dielectric material.

Example 5 includes the capacitor of example 4, or of any other example or embodiment described herein, wherein the high-k dielectric material is an epoxy.

Example 6 includes the capacitor of example 1, or of any other example or embodiment described herein, wherein the dielectric material is a first dielectric material; and further comprising a fourth layer of a second dielectric material on the third layer.

Example 7 includes the capacitor of example 6, or of any other example or embodiment described herein, wherein the first dielectric material and the second dielectric material are a same material.

Example 8 includes the capacitor of example 1, or of any other example or embodiment described herein, wherein a cross section of the via in a plane parallel to the first side of the substrate has a shape that is a selected one of: a circle, a rectangle, an ellipse, a serpentine, or an irregular shape.

Example 9 includes the capacitor of example 1, or of any other example or embodiment described herein, wherein the via is a first via; and further comprising: a second via extending from the first side of the substrate to the second side of the substrate; a first layer of electrically conductive material on an inside surface of the second via, the first layer extending from the first side of the substrate to the second side of the substrate; a second layer of dielectric material on the first layer of the second via, the second layer extending from the first side of the substrate to the second side of the substrate; a third layer of electrically conductive material on the second layer of the second via, the third layer extending from the first side of the substrate to the second side of the substrate; and wherein the first layer of the second via and the third layer of the second via are electrically isolated from each other.

Example 10 includes the capacitor of example 9, or of any other example or embodiment described herein, wherein the first layer of electrically conductive material of the first via is electrically coupled with the first layer of electrically conductive material of the second via, and wherein the third layer of electrically conductive material of the first via is electrically coupled with the third layer of electrically conductive material of the second via.

Example 11 includes the capacitor of example 1, or of any other example or embodiment described herein, wherein the substrate is a sub laminate within a substrate.

Example 12 includes the capacitor of example 1, or of any other example or embodiment described herein, wherein the electrically conductive material includes copper.

Example 13 includes the capacitor of example 1, or of any other example or embodiment described herein, wherein the dielectric includes a selected one or more of: titanium, oxygen, titanium dioxide, carbon, or graphine.

Example 14 is a system comprising: a substrate having a first side and a second side opposite the first side; a die on the first side of the substrate, the die electrically coupled with a capacitor; and the capacitor that includes: a via extending from the first side of the substrate to the second side of the substrate; a first layer of electrically conductive material on an inside surface of the via, the first layer extending from the first side of the substrate to the second side of the substrate; a second layer of dielectric material on the first layer, the second layer extending from the first side of the substrate to the second side of the substrate; a third layer of electrically conductive material on the second layer, the third layer extending from the first side of the substrate to the second side of the substrate; and wherein the first layer and the third layer are electrically isolated from each other.

Example 15 includes the system of example 14, or of any other example or embodiment described herein, wherein the capacitor is electrically coupled with a ground plane of the substrate.

Example 16 includes the system of example 14, or of any other example or embodiment described herein, wherein the die is at least partially over an opening of the via.

Example 17 includes a system of example 14, or of any other example or embodiment described herein, wherein the dielectric material is a high-k material that includes an epoxy, and wherein the electrically conductive material includes copper.

Example 18 includes the system of example 14, or of any other example or embodiment described herein, further comprising a voltage regulator module (VRM) coupled with the first side of the substrate and electrically coupled with the capacitor.

Example 19 includes a system of example 14, or of any other example or embodiment described herein, wherein the capacitor is a decoupling capacitor.

Example 20 is a method comprising: providing a substrate; forming a via within the substrate from a first side of the substrate to a second side of the substrate opposite the first side; forming a first layer of electrically conductive material on an inside surface of the via; forming a second layer of dielectric material on the first layer, the second layer extending from the first side of the substrate to the second side of the substrate; and forming a third layer of electrically conductive material on the second layer, the third layer extending from the first side of the substrate to the second side of the substrate, wherein the first layer and the third layer are electrically isolated from each other.

Example 21 includes the method of example 20, or of any other example or embodiment described herein, wherein the dielectric is a high-k epoxy.

Example 22 includes the method of example 20, or of any other example or embodiment described herein, wherein the electrically conductive material includes copper.

Example 23 includes the method of example 20, or of any other example or embodiment described herein, wherein the dielectric material is a first dielectric material; and further comprising forming a fourth layer of a second dielectric material on the third layer of electrically conductive material, the fourth layer extending from the first side of the substrate to the second side of the substrate.

Example 24 includes the method of example 20, or of any other example or embodiment described herein, wherein the second dielectric is a high-k epoxy.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A capacitor comprising:
    a substrate with a first side and a second side opposite the first side;
    a via extending from the first side of the substrate to the second side of the substrate;
    a first layer of electrically conductive material on an inside surface of the via, the first layer extending from the first side of the substrate to the second side of the substrate;
    a second layer of dielectric material on the first layer, the second layer extending from the first side of the substrate to the second side of the substrate;
    a third layer of electrically conductive material on the second layer, the third layer extending from the first side of the substrate to the second side of the substrate; and
    wherein the first layer and the third layer are electrically isolated from each other, wherein the third layer has an uppermost surface at a same level as an uppermost surface of the first layer, and wherein the third layer has a bottommost surface at a same level as a bottommost surface of the first layer.

2. The capacitor of claim 1, wherein the first layer, the second layer, and the third layer are substantially perpendicular to the first side of the substrate.

3. The capacitor of claim 1, wherein the substrate includes a layer of glass.

4. The capacitor of claim 1, wherein the dielectric material is a high-k dielectric material.

5. The capacitor of claim 4, wherein the high-k dielectric material is an epoxy.

6. The capacitor of claim 1, wherein the dielectric material is a first dielectric material; and further comprising a fourth layer of a second dielectric material on the third layer.

7. The capacitor of claim 6, wherein the first dielectric material and the second dielectric material are a same material.

8. The capacitor of claim 1, wherein a cross section of the via in a plane parallel to the first side of the substrate has a shape that is a selected one of: a circle, a rectangle, an ellipse, a serpentine, or an irregular shape.

9. The capacitor of claim 1, wherein the via is a first via; and further comprising:
    a second via extending from the first side of the substrate to the second side of the substrate;
    a first layer of electrically conductive material on an inside surface of the second via, the first layer extending from the first side of the substrate to the second side of the substrate;
    a second layer of dielectric material on the first layer of the second via, the second layer extending from the first side of the substrate to the second side of the substrate;
    a third layer of electrically conductive material on the second layer of the second via, the third layer extending from the first side of the substrate to the second side of the substrate; and
    wherein the first layer of the second via and the third layer of the second via are electrically isolated from each other.

10. The capacitor of claim 9, wherein the first layer of electrically conductive material of the first via is electrically coupled with the first layer of electrically conductive material of the second via, and wherein the third layer of electrically conductive material of the first via is electrically coupled with the third layer of electrically conductive material of the second via.

11. The capacitor of claim 1, wherein the substrate is a sub laminate within a substrate.

12. The capacitor of claim 1, wherein the electrically conductive material includes copper.

13. The capacitor of claim 1, wherein the dielectric includes a selected one or more of: titanium, oxygen, titanium dioxide, carbon, or graphine.

14. A system comprising:
    a substrate having a first side and a second side opposite the first side;
    a die on the first side of the substrate, the die electrically coupled with a capacitor; and
    the capacitor that includes:
        a via extending from the first side of the substrate to the second side of the substrate;
        a first layer of electrically conductive material on an inside surface of the via, the first layer extending from the first side of the substrate to the second side of the substrate;
        a second layer of dielectric material on the first layer, the second layer extending from the first side of the substrate to the second side of the substrate;
        a third layer of electrically conductive material on the second layer, the third layer extending from the first side of the substrate to the second side of the substrate; and
        wherein the first layer and the third layer are electrically isolated from each other, wherein the third layer has an uppermost surface at a same level as an uppermost surface of the first layer, and wherein the third layer has a bottommost surface at a same level as a bottommost surface of the first layer.

15. The system of claim 14, wherein the capacitor is electrically coupled with a ground plane of the substrate.

16. The system of claim 14, wherein the die is at least partially over an opening of the via.

17. The system of claim 14, wherein the dielectric material is a high-k material that includes an epoxy, and wherein the electrically conductive material includes copper.

18. The system of claim 14, further comprising a voltage regulator module (VRM) coupled with the first side of the substrate and electrically coupled with the capacitor.

19. The system of claim 14, wherein the capacitor is a decoupling capacitor.

20. A method comprising:
    providing a substrate;
    forming a via within the substrate from a first side of the substrate to a second side of the substrate opposite the first side;

forming a first layer of electrically conductive material on an inside surface of the via;

forming a second layer of dielectric material on the first layer, the second layer extending from the first side of the substrate to the second side of the substrate; and forming a third layer of electrically conductive material on the second layer, the third layer extending from the first side of the substrate to the second side of the substrate, wherein the first layer and the third layer are electrically isolated from each other, wherein the third layer has an uppermost surface at a same level as an uppermost surface of the first layer, and wherein the third layer has a bottommost surface at a same level as a bottommost surface of the first layer.

21. The method of claim 20, wherein the dielectric is a high-k epoxy.

22. The method of claim 20, wherein the electrically conductive material includes copper.

23. The method of claim 20, wherein the dielectric material is a first dielectric material; and further comprising forming a fourth layer of a second dielectric material on the third layer of electrically conductive material, the fourth layer extending from the first side of the substrate to the second side of the substrate.

24. The method of claim 20, wherein the second dielectric is a high-k epoxy.

* * * * *